United States Patent
Ke et al.

(10) Patent No.: US 9,875,939 B1
(45) Date of Patent: Jan. 23, 2018

(54) METHODS OF FORMING UNIFORM AND PITCH INDEPENDENT FIN RECESS

(71) Applicant: GLOBALFOUNDRIES Inc., Grand Cayman (KY)

(72) Inventors: Yue Ke, Arlington, MA (US); Alexander Reznicek, Troy, NY (US); Benjamin Moser, Malta, NY (US); Dominic J. Schepis, Wappingers Falls, NY (US); Melissa A. Smith, Cambridge, MA (US); Henry K. Utomo, Newburgh, NY (US); Reinaldo Vega, Mahopac, NY (US); Sameer Jain, Hopewell Junction, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/373,129

(22) Filed: Dec. 8, 2016

(51) Int. Cl.
| H01L 21/8234 | (2006.01) |
| H01L 21/02 | (2006.01) |
| H01L 21/306 | (2006.01) |
| H01L 21/324 | (2006.01) |
| H01L 21/266 | (2006.01) |
| H01L 29/165 | (2006.01) |
| H01L 29/66 | (2006.01) |

(52) U.S. Cl.
CPC ........ *H01L 21/823431* (2013.01); *H01L 21/02532* (2013.01); *H01L 21/266* (2013.01); *H01L 21/30604* (2013.01); *H01L 21/324* (2013.01); *H01L 29/165* (2013.01); *H01L 29/66795* (2013.01)

(58) Field of Classification Search
None
See application file for complete search history.

(56) References Cited

U.S. PATENT DOCUMENTS

| 9,589,845 B1* | 3/2017 | Jagannathan ..... H01L 21/82343 |
| 2014/0151766 A1* | 6/2014 | Eneman .............. H01L 29/1054 257/288 |

* cited by examiner

*Primary Examiner* — Asok K Sarkar
(74) *Attorney, Agent, or Firm* — Heslin Rothenberg Farley & Mesiti P.C.

(57) ABSTRACT

Methods of fabricating integrated circuit devices for forming uniform and well controlled fin recesses are disclosed. One method includes, for instance: obtaining an intermediate semiconductor structure having a substrate, at least one fin disposed on the substrate, at least one gate structure positioned over the at least one fin, and at least one oxide layer disposed on the substrate and about the at least one fin and the at least one gate structure; implanting germanium (Ge) in a first region of the at least one fin; and removing the first region of the at least one fin implanted with Ge.

20 Claims, 8 Drawing Sheets

US 9,875,939 B1

METHODS OF FORMING UNIFORM AND PITCH INDEPENDENT FIN RECESS

FIELD OF THE DISCLOSURE

The present invention relates to methods of fabricating semiconductor devices, and more particularly, to methods of forming uniform and pitch independent fin recess in semiconductor devices.

BACKGROUND OF THE DISCLOSURE

Generally, the bulk FinFET technology uses recessed fin for junction control and epi growth template. The recess is generally achieved by wet and dry etching methods, such as $NH_4OH$ and $CF_4$, $HBrO_4$, Cl based reactive ion etch (RIE) chemistry. Such techniques have problems with cross-macro uniformity, as well as process control to achieve uniform recess depth. Recessed fins in source and/or drain regions are often non-uniform and dependent on gate pitch due to the pitch dependence of RIE. The recessed fins typically have rounded corners, a typical characteristic of RIE chemistry, with the rounding being more prominent when pitch is tighter.

BRIEF SUMMARY

The shortcomings of the prior art are overcome and additional advantages are provided through the provision, in one embodiment, a method that includes, for instance: obtaining an intermediate semiconductor structure having a substrate, at least one fin disposed on the substrate, at least one gate structure positioned over the at least one fin, and at least one oxide layer disposed on the substrate and about the at least one fin and the at least one gate structure; implanting germanium (Ge) in a first region of the at least one fin; and removing the first region of the at least one fin implanted with Ge.

In another embodiment, a method is provided that includes, for instance: providing a wafer having at least one silicon fin disposed on the substrate, at least one gate structure positioned over the at least one silicon fin, and at least one oxide layer disposed on the wafer and about the at least one silicon fin and the at least one gate structure; forming silicon germanium alloy (SiGe) in a first region of the at least one fin; and forming a recess in the first region of the at least one fin.

Additional features and advantages are realized through the principles of the present invention. Other embodiments of the disclosure are described in detail herein and are considered to be part of the claimed disclosure.

BRIEF DESCRIPTION OF THE DRAWINGS

One or more embodiments of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Generally stated, disclosed herein are methods of fabrication of certain integrated circuits, including transistor devices for bulk and silicon on insulator (SOI) fin technology, which provide advantages over the above noted, existing semiconductor device fabrication processes. Advantageously, the integrated circuit device fabrication processes disclosed herein provide for semiconductor devices with uniform fin recesses without loading dependencies or significant corner rounding. As will be appreciated, the present disclosure may provide a pitch independent and precise depth control of fin recess for very-large-scale-integration (VLSI) complementary metal oxide semiconductor (CMOS) manufacturing for bulk and silicon on insulator (SOI) technologies.

As used herein, the term "SiGe" or "silicon germanium" refers generally to the alloy having any molar ratio of silicon and germanium, with a molecular formula of the form $Si_{1-x}Ge_x$. The term "SiGe" or "silicon germanium" may also include amorphous silicon germanium (a-SiGe) alloy.

Figure 1:
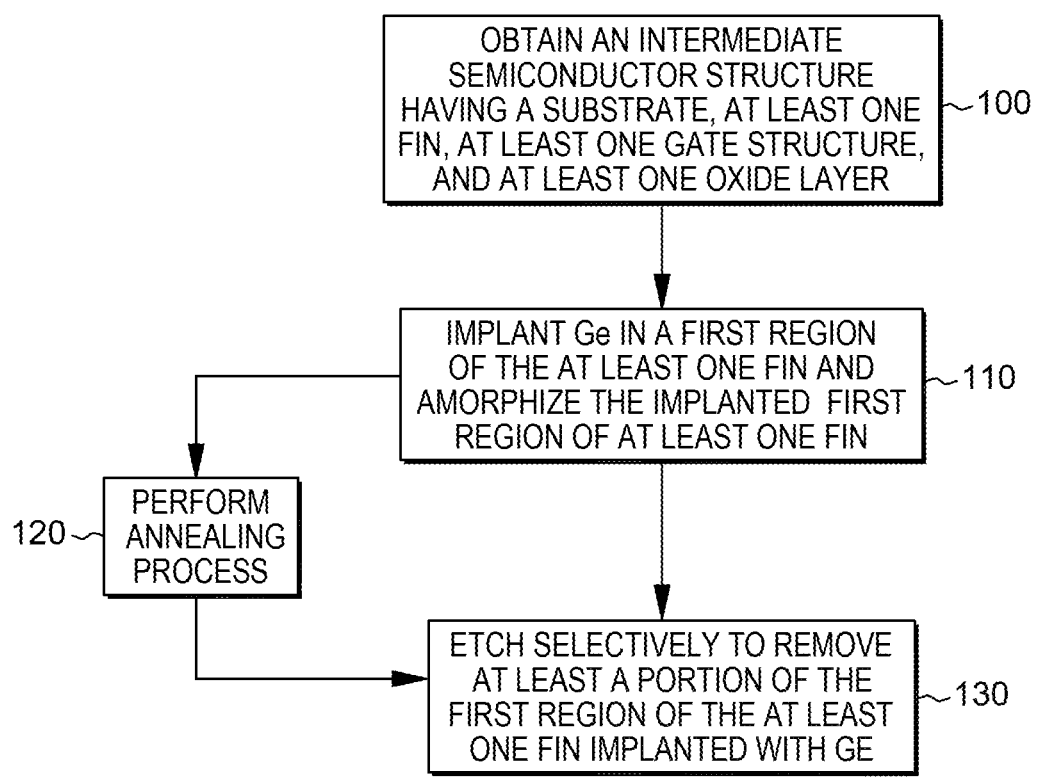
FIG. 1 is a flowchart of a method for forming uniform fin recess according to an embodiment of the present disclosure.

In one embodiment, as shown in FIG. 1, a method according to an embodiment of the present disclosure for forming an integrated circuit device is provided. The method may include, for instance: at 100 obtaining an intermediate semiconductor structure having a substrate, at least one fin, at least one gate structure, and at least one oxide layer; at 110 implanting germanium (Ge) in a first region of the fin and amorphizing the implanted first region of the fin; at 120, optionally performing an annealing process; and at 130 etching selectively to remove at least a portion of the first region of the fin implanted with Ge.

FIGS. 2-8 depict, by way of example only, one detailed embodiment of a portion of the semiconductor device formation process and a portion of an intermediate semiconductor structure, for example, semiconductor devices fabricated from a semiconductor wafer, in accordance with one or more aspects of the present invention. Note that these figures are not drawn to scale in order to facilitate understanding of the invention, and that the same reference numerals used throughout different figures designate the same or similar elements.

Figure 2:
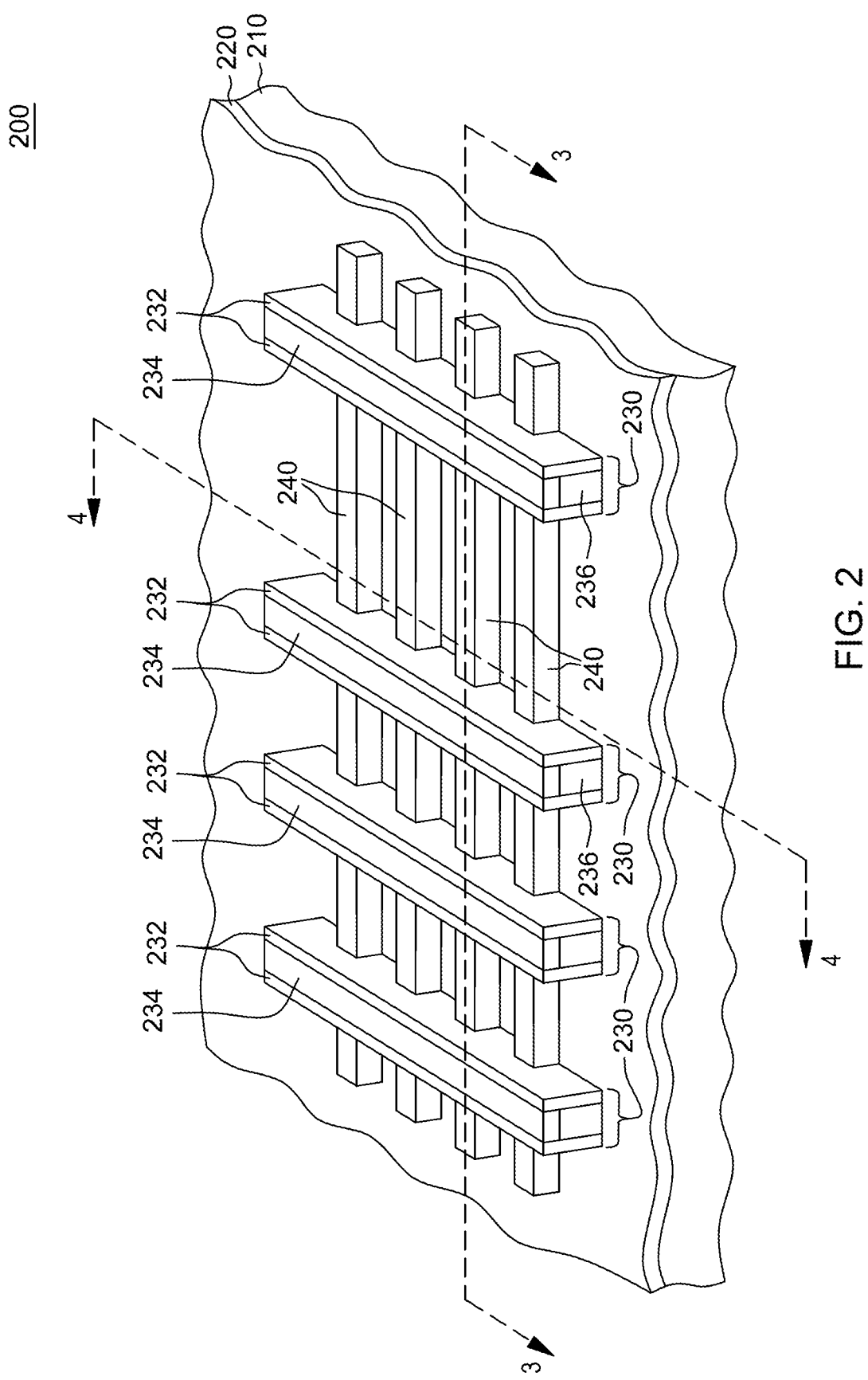
FIG. 2 depicts an isometric view of one embodiment of an intermediate semiconductor device having a plurality of fins and a plurality of gate structures, disposed on a substrate, according to an embodiment of the present disclosure.

FIG. 2 depicts a portion of an intermediate semiconductor device 200 obtained during the fabrication process. Device 200 may be or include a wafer. Device 200 may have been processed through initial device processing steps in accordance with the design of the device being fabricated. For example, device 200 may include a substrate 210, an oxide layer 220, one or more gate structures 230, and one or more fins 240. One or more gate structures 230 may further include gate spacers 232, a gate hard mask 234, and a gate 236. For instance, gate hard mask 234 may be positioned on top of gate 236, and gate spacers 232 may be positioned on the left and right sides of gate 236 and gate hard mask 234. Gate structures 230 may be positioned to conform over and partially wrap around one or more fins 240. Device 200 may also include source regions to the left (or right) of gate structures 230 (not shown as fully formed), drain regions to the right (or left) of gate structures 230 (not shown as fully formed), and the like. Fins 240 may be, for example, silicon fins. Fins 240 may also be, for example, continuous such that multiple gate structures may be disposed over a single fin. For instance, device 200 may include a plurality of fins 240 and the space between the fins, such as a first fin and a second fin, may be filled with an isolation material (not shown), for example, oxide. The second fin may be positioned adjacent to the first fin.

As shown in FIG. 2, substrate 210 of device 200 may be, for instance, a bulk substrate. Substrate 210 may be, for example, a silicon bulk substrate or wafer. As will be appreciated, substrate may be other suitable materials, including bulk, silicon on insulator (SOI), and silicon on sapphire. Oxide layer 220 may be disposed on substrate 210. Oxide layer 220 may also be disposed about gate structures 230 and fins 240, i.e. oxide layer 220 may be disposed on the substrate 210 and surround gate structures 230 and fins 240.

In another embodiment (not shown), the substrate of device 200 may be, for example, a silicon on insulator (SOI) substrate. For example, the SOI substrate may include an isolation layer (not shown), which may be a local buried oxide region (BOX) or any suitable material for electrically isolating transistors, aligned with one or more gate structures.

As also shown in FIG. 2, gate structures 230 may be positioned over and partially wrap around fins 240, such that at least a portion of gate structures 230 may be disposed on at least a portion of fins 240 and at least a portion of gate structures 230 may be disposed on substrate 210 and surrounded by oxide layer 220.

Figure 3:
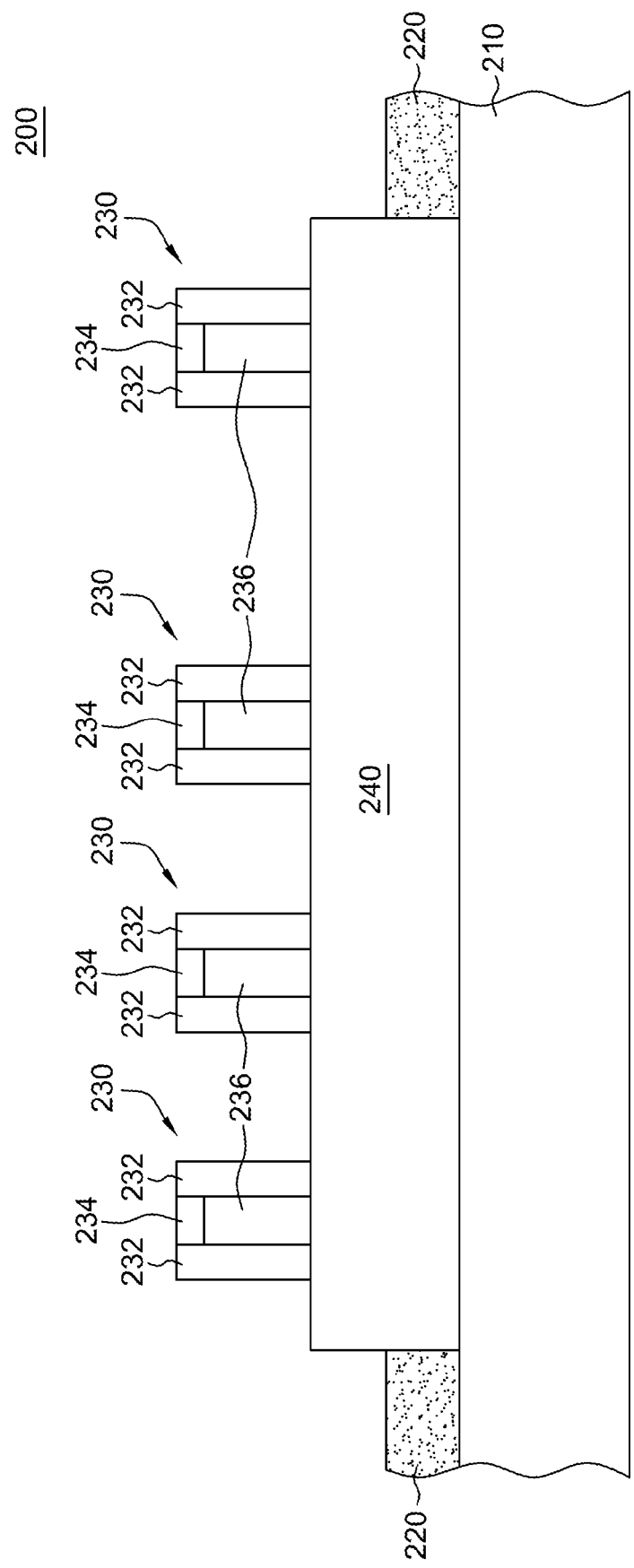
FIG. 3 depicts a cross-sectional elevational view of the structure of FIG. 2 taken along line 3-3.

As shown in FIG. 3, oxide layer 220 may be in contact with at least a portion of fins 240. For example, fins 240 may be disposed on substrate 210, and oxide layer 220 may be disposed on substrate 210 and surround fins 240, such that at least a portion of fins 240 may be positioned above oxide layer 220 and at least a portion of fins 240 may be below oxide layer 220.

Figure 4:
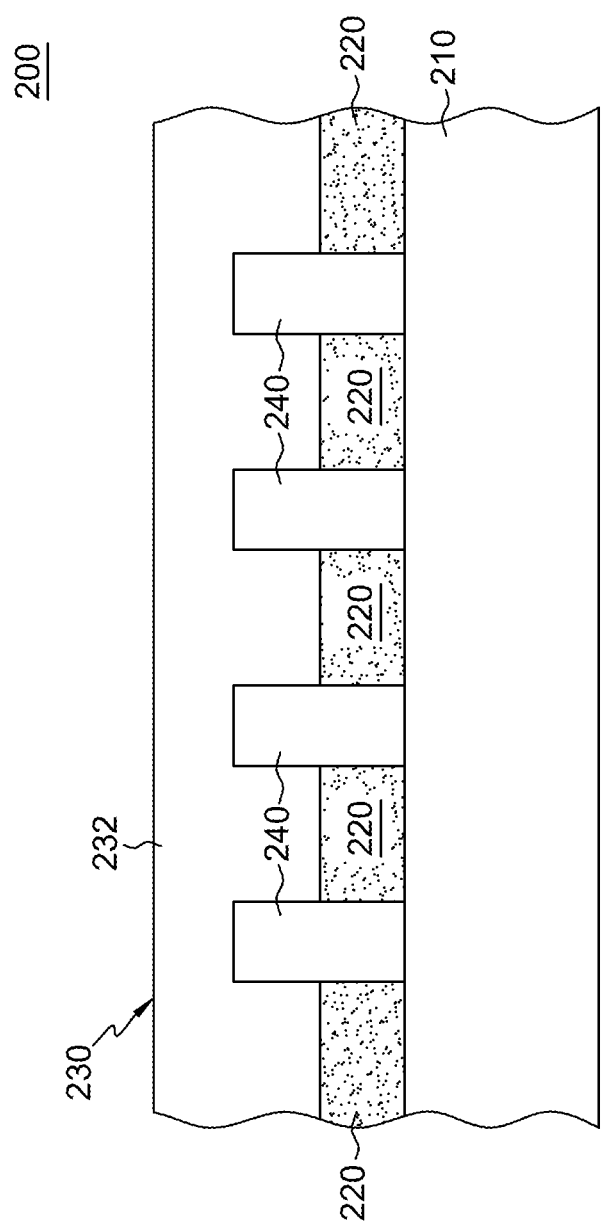
FIG. 4 depicts a cross-sectional elevational view of the structure of FIG. 2 taken along line 4-4.

As shown in FIGS. 3 and 4, gate structures 230 may be positioned to conform to and partially wrap around fins 240. For example, at least a portion of gate structures 230 may be disposed on oxide layer 220 (FIG. 4) and may be disposed conformally on a portion of fins 240, overlapping fins 240 in certain areas.

Figure 5:
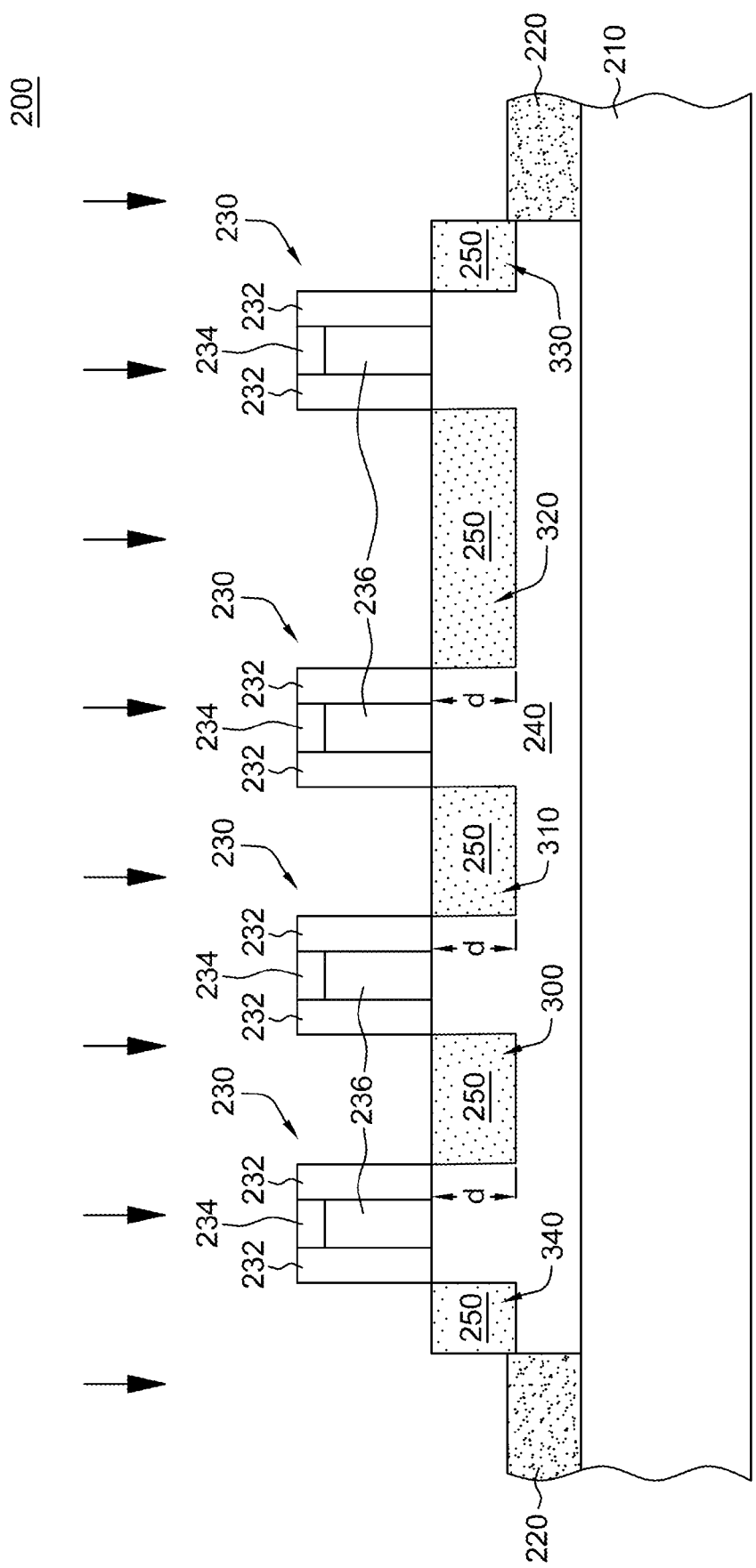
FIG. 5 depicts the structure of FIG. 3 undergoing germanium implantation.
Figure 6:
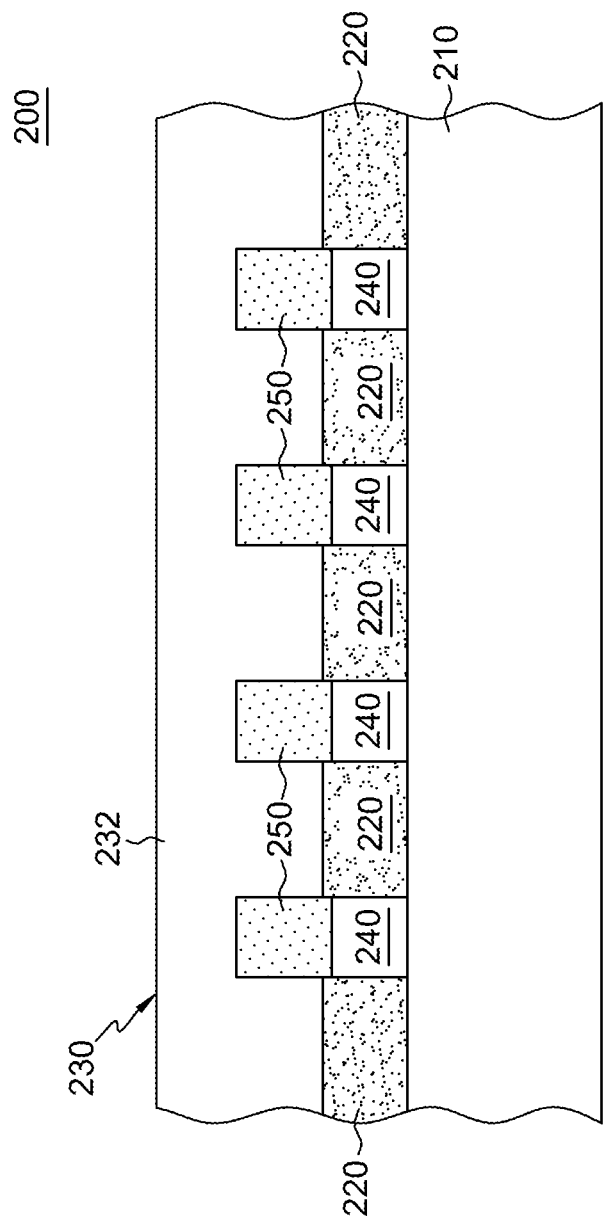
FIG. 6 depicts the structure of FIG. 4 after undergoing germanium implantation.

As shown in FIG. 5, germanium (Ge) implantation may be performed over device 200 to implant Ge ions in at least a portion of fins 240, for example, in the region between gate structures 230. One or more Ge implantation process may be performed over device 200, for example, Ge implants of varying doses or energy may be formed in device 200. In embodiments with more than one Ge implant, device 200 may have recesses formed of different depths, corresponding to the different Ge implants. The recesses may be formed by a single etch after one or more Ge implantation process is complete. Alternatively, it is also contemplated that the recesses may be formed by multiple etches, for example, a recess may be formed after each Ge implantation when multiple implantations are desired. Then, an epitaxial source/drain growth may be performed after each recess is formed and prior to the next Ge implantation process. The epitaxial source/drain growth may be the same or different material in each layer when the recesses are formed in multiple etches. Ge implantation may be performed, for example, to intentionally damage the silicon in fins 240. Ge may be implanted into fins 240 in a controlled manner, such that Ge may be implanted in certain defined regions of the fins, implanted at a certain depth, and so forth. For instance, defined regions for implantation may include the region between gate structures, or adjacent to gate structures, and gate structures may be used as implantation masks. Ge implantation may, for instance, amorphize the silicon in fins 240 and may simultaneously form a silicon germanium alloy (SiGe) 250, as also shown in FIG. 6. SiGe 250 may be, for example, an amorphous silicon germanium alloy (a-SiGe).

For instance, as shown in FIG. 5, Ge may be implanted in a first region 300 of fin 240. Fin 240 may be implanted with Ge within a defined region at a desired depth, which is illustrated as double-headed arrow labeled with "d". The desired depth of the implantation will vary depending on the device design. Ge implantation may be performed in accordance with conventional methods and techniques apparent to one skilled in the art. Ge may also be implanted in other defined portions of fin 240, such as, a second region 310, a third region 320, fourth region 330, fifth region 340, and so forth, by, for example, using gate structures 230 as implantation masks. The implantation of first region 300, second region 310, third region 320, fourth region 330, fifth region 340, and/or other defined regions may be performed simultaneously. The implantation of first region 300, second region 310, third region 320, fourth region 330, fifth region 340, and/or other defined regions may be performed serially and may be performed with varying doses and energy. In embodiments where one or more Ge implantation processes are performed, device 200 may have recesses formed of different depths, corresponding to the different Ge implants (not shown).

Upon Ge implantation, the implanted portions or regions of the fins may be amorphized, for instance, the Ge may amorphize the silicon in the implanted regions of the fin. With reference still to FIG. 5, for example, within first region 300, second region 310, third region 320, fourth region 330, and fifth region 340, of fin 240, implanted Ge may amorphize the silicon and simultaneously form SiGe 250, such as a-SiGe, in first region 300, second region 310, third region 320, fourth region 330, and fifth region 340.

An optional annealing process may be performed (not shown) to the structure after Ge implantation, for example, to recrystallize SiGe and sharpen the interface between the silicon and SiGe in the fins. As will be appreciated, the annealing process may further clearly define the implanted portion of the fins from the non-implanted portion of the fins. The annealing process may be performed at an appropriate temperature, for instance, between 500° C. and 1250° C., and for example, at 600° C.

Figure 7:
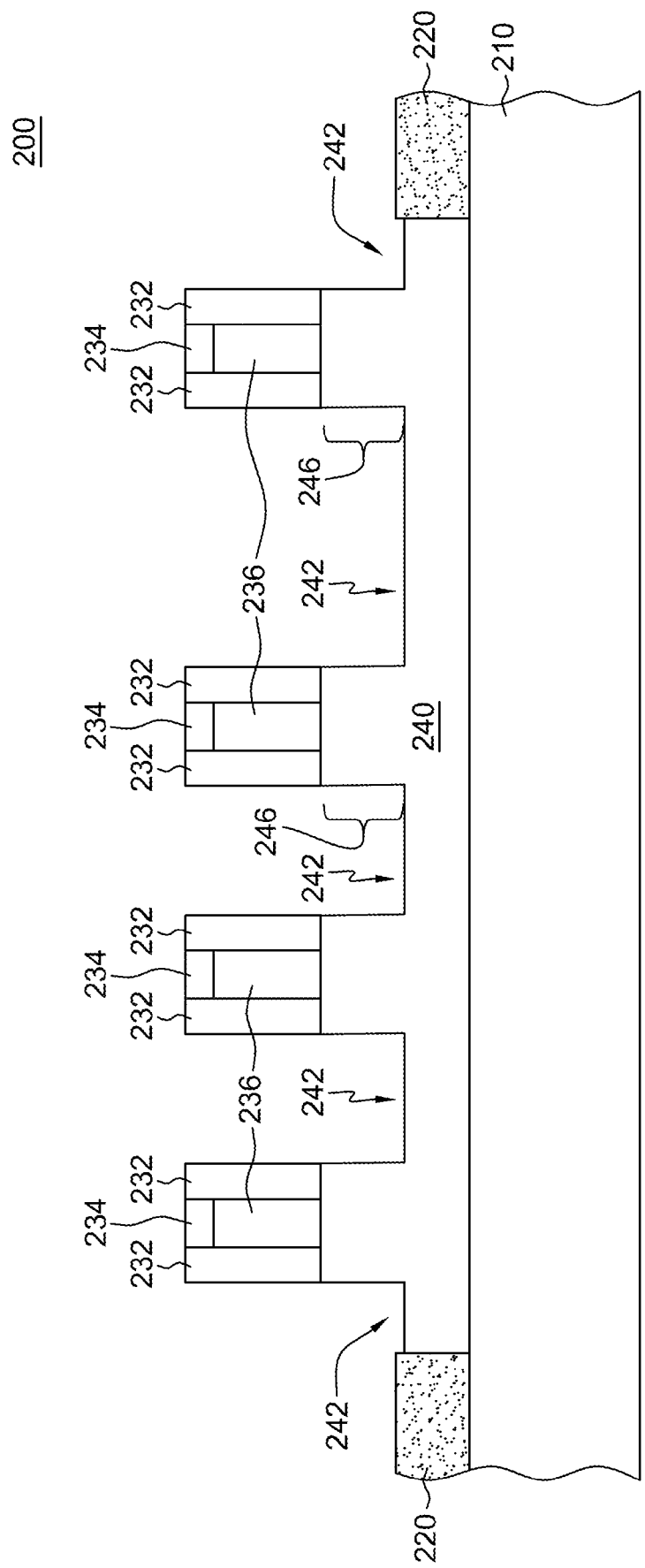
FIG. 7 depicts the structure of FIG. 5 after etching to selectively remove silicon germanium.

As shown in FIG. 7, etching may be performed to selectively remove SiGe 250 (FIG. 5) from fin 240 and form recesses 242 in fin 240. Recesses 242 formed may be of uniform depth and may be formed without loading dependence. Recesses 242 may also be formed without significant corner rounding. For example, formed recesses 242 may all have the same depth in fin 240, i.e. uniform depth, regardless of gate pitch, i.e. the distance between the center of one gate structure to the center of an adjacent gate structure. The shape of the formed recesses may be determined by, for example, the implant damage and is not limited to any particular shape. For instance, in some embodiments (not shown) Ge may be implanted within the whole depth of the fin, such that Ge amorphizes and forms SiGe of a portion of the fin extending the entire depth of the fin. When SiGe is selectively etched, one or more recesses may be formed that extends through the depth of the fin and to the substrate.

Figure 8:
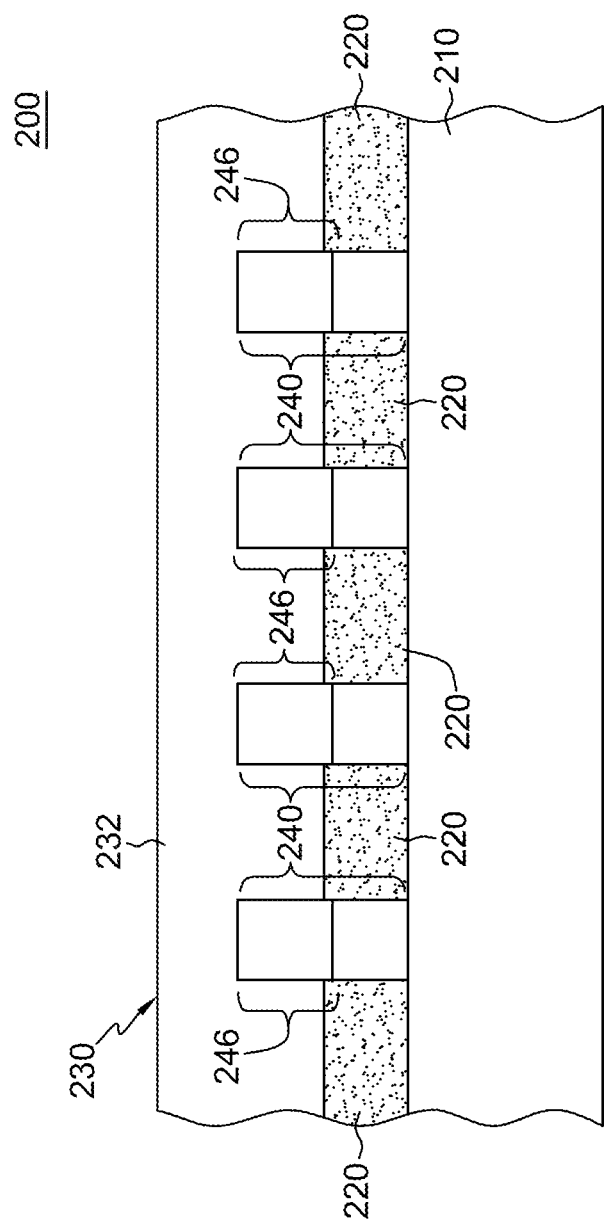
FIG. 8 depicts the structure of FIG. 6 after etching to selectively remove silicon germanium.

Upon formation of recesses 242, one or more fins 240 may include remaining upper portions 246 of fins 240 (i.e. the upper portion of the fins after the selective etching), as shown in FIGS. 7 and 8. Remaining upper portions 246 may be, for example, positioned under gate structures 230 and may have a width that is the same as the corresponding gate structure 230.

As illustrated in FIG. 8, recesses 242 (FIG. 7) may be formed in plurality of fins, with all recesses 242 having, for example, uniform depth, independent of pitch. In some embodiments, one or more recesses may have uniform depth and shape. With reference still to FIG. 8, the uniformity of recesses 242 is also represented by the uniformity of remaining upper portions 246 of fins 240. As described above, uniformity may be achieved by Ge implantation, i.e. the depth of the Ge ion implantation. Any conventional selective etching methods and techniques, and suitable reactor may be used, for example, hydrochloric acid (HCl) gas in an epitaxial chamber, to selectively etch SiGe to remove SiGe from fins 240, and form one or more recesses.

In another embodiment where the substrate is a SOI substrate (not shown), the depth of the recesses within the fins will depend on the device design. In some instances, recesses may extend down to the BOX (not shown) or to a depth where a layer of silicon remains on the BOX (not shown).

Following the formation of the recesses 242, shown in FIGS. 7 and 8, device 200 may be passed to continue with the fabrication process, for example, filling the recesses with suitable materials, for instance, SiGe:B, SiC:P or Si:P, SiGe:B and SiC:P, to form Source/Drain Junction.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features.

Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor structure having a substrate, at least one fin disposed on the substrate, at least two gate structures positioned over the at least one fin, and at least one oxide layer disposed on the substrate and about the at least one fin and the at least two gate structures;
   implanting germanium (Ge) in a first region of the at least one fin between the at least two gate structures; and
   removing the first region of the at least one fin implanted with Ge.

2. The method of claim 1 further comprising forming a silicon germanium alloy (SiGe) in the first region of the at least one fin.

3. The method of claim 2, wherein forming the SiGe occurs simultaneously with implanting Ge in the first region of the at least one fin.

4. The method of claim 2, wherein removing the first region of the at least one fin implanted with Ge comprises selectively etching the SiGe from the first region of the at least one fin.

5. The method of claim 4, further comprising:
   forming at least one recess within the at least one fin between the at least two gate structures.

6. The method of claim 5, wherein forming the at least one recess occurs simultaneously with the selective etching of the SiGe.

7. The method of claim 4, wherein the selectively etching the SiGe comprises forming plurality of recesses within the at least one fin, wherein the plurality of recesses are uniform in depth.

8. The method of claim 1 further comprising performing an annealing process to the at least one fin implanted with Ge.

9. The method of claim 8, wherein the annealing process is performed at a temperature between 500° C. and 1250° C.

10. The method of claim 1 further comprising performing at least one second Ge implantation process in the first region of the at least one fin.

11. The method of claim 1, wherein the at least one fin is a silicon fin.

12. The method of claim 1, wherein each of the gate structures of the at least two gate structures comprises a gate, gate spacers, and a gate hard mask.

13. The method of claim 12, wherein the gate hard mask is disposed on top of the gate and the gate spacers are positioned on the sides of the gate and the gate hard mask.

14. The method of claim 1, wherein the implanting Ge further comprises utilizing the at least two gate structures as an implantation mask.

15. A method comprising:
providing a wafer, at least one silicon fin disposed on the wafer, at least one gate structure positioned over the at least one silicon fin, and at least one oxide layer disposed on the wafer and about the at least one silicon fin and the at least one gate structure;
forming silicon germanium alloy (SiGe) in a first region of the at least one fin positioned between two gate structures of the at least one gate structure; and
forming at least one recess in the first region of the at least one fin.

16. The method of claim 15 further comprising implanting germanium (Ge) in the first region of the at least one fin.

17. The method of claim 16, wherein implanting Ge in the first region of the at least one fin occurs simultaneously with forming the SiGe.

18. The method of claim 16, wherein the implanting Ge further comprises utilizing the at least one gate structure as an implantation mask.

19. The method of claim 15, wherein the recess is formed in the first region of the at least one fin by selectively etching the SiGe from the first region of the at least one fin.

20. The method of claim 15 further comprising performing an annealing process over the wafer.

* * * * *